United States Patent [19]

Yatsuo et al.

[11] Patent Number: 4,651,189

[45] Date of Patent: Mar. 17, 1987

[54] SEMICONDUCTOR DEVICE PROVIDED WITH ELECTRICALLY FLOATING CONTROL ELECTRODE

[75] Inventors: Tsutomu Yatsuo; Takahiro Nagano; Saburo Oikawa; Yukimasa Sato; Shin Kimura; Hiroshi Fukui, all of Hitachi, Japan

[73] Assignee: Hitachi, Ltd., Tokyo, Japan

[21] Appl. No.: 680,837

[22] Filed: Dec. 12, 1984

[30] Foreign Application Priority Data

Dec. 19, 1983 [JP] Japan .................................. 58-237766
Dec. 19, 1983 [JP] Japan .................................. 58-237767

[51] Int. Cl.$^4$ ............................................. H01L 29/74
[52] U.S. Cl. ........................................ 357/38; 357/20; 357/51; 357/55; 357/86
[58] Field of Search ...................... 357/20, 38, 86, 55, 357/51

[56] References Cited

U.S. PATENT DOCUMENTS

| | | | |
|---|---|---|---|
| 3,097,335 | 7/1963 | Schmidt | 357/38 |
| 3,124,703 | 3/1964 | Sylvan | 357/38 |
| 3,271,587 | 9/1966 | Schreiner | 357/38 |
| 3,277,310 | 10/1966 | Schreiner | 357/38 |
| 3,300,694 | 1/1967 | Stehney et al. | 357/38 |
| 3,486,088 | 12/1969 | Gray et al. | 357/38 |
| 4,170,020 | 10/1979 | Sueoka et al. | 357/38 |
| 4,315,274 | 2/1982 | Fukui et al. | 357/86 |
| 4,325,074 | 4/1982 | Osada et al. | 357/38 |
| 4,345,266 | 8/1982 | Owyang | 357/38 |
| 4,491,742 | 1/1985 | Akamatsu | 357/38 |

FOREIGN PATENT DOCUMENTS 57-78172  5/1982  Japan .................................. 357/38.6

Primary Examiner—Joseph E. Clawson, Jr.
Attorney, Agent, or Firm—Antonelli, Terry & Wands

[57] ABSTRACT

A gate turn-off thyristor and a transistor are disclosed, each of which comprises: a semiconductor substrate including at least three semiconductor layers between a pair of principal surfaces, adjacent ones of the semiconductor layers being different in conductivity type from each other, a first one of the semiconductor layers being formed of at least one strip-shaped region with a constant width, a second one of the semiconductor layers being exposed to a first principal surface of the semiconductor substrate together with the strip-shaped region; a first main electrode kept in ohmic contact with the strip-shaped region at the first principal surface; a first control electrode kept in ohmic contact with the second semiconductor layer on one side of the strip-shaped region in the direction of the width thereof and connected directly to a control terminal; a second control electrode kept in ohmic contact with the second semiconductor layer on the other side of the strip-shaped region in the direction of the width thereof and connected to the control terminal through the first control electrode and the resistance of the second semiconductor layer between the first control electrode and the second control electrode; a second main electrode kept in ohmic contact with a second principal surface of the semiconductor substrate; and means provided in the semiconductor substrate for accelerating the spatial biasing of a conductive region to the other side of the strip-shaped region in the direction of the width thereof when a current flowing across the semiconductor substrate is cut off, thereby enlarging the area of safety operation.

5 Claims, 20 Drawing Figures

SEMICONDUCTOR DEVICE PROVIDED WITH ELECTRICALLY FLOATING CONTROL ELECTRODE

CROSS REFERENCE TO RELATED APPLICATION

This application relates to the subject matter disclosed in U.S. patent application, Ser. No. 585,606, filed on Mar. 2, 1984 by Kimura et al and assigned to the present assignee.

The present invention relates to a semiconductor device which is provided with a control electrode to cut off a main current by a control signal, such as a gate turn-off thyristor (hereinafter simply referred to as "GTO" or a transistor (hereinafter simply referred to as "TRS") capable of being turned off by a control current, and more particulary to the structure of control electrode and the junction structure for improving the current cut-off performance of the semiconductor device.

Vertical semiconductor devices which allow a main current to flow across the thickness of a substrate, are fitted for high power devices.

A GTO or TRS of vertical type usually has the following structure. An emitter layer is formed of at least one strip-shaped region having a constant width, disposed in a base layer, and exposed to one principal surface of a semiconductor substrate together with the base layer adjacent to the emitter layer. One main electrode is formed on and in contact with the strip-shaped region, and a control electrode is formed on and in contact with the base layer so that the control electrode exists on both sides of the strip-shaped region in the direction of the width thereof and thus the strip-shaped region is substantially surrounded by the control electrode. Further, the other main electrode is formed on and in contact with the other principal surface of the semiconductor substrate. Each of the main electrodes is connected to a corresponding one of a pair of main terminals, and the control electrode is connected to a control terminal. A GTO having such a structure is disclosed in U.S. Pat. No. 3,474,303.

Now, a GTO will be explained below in detail, by way of example. FIG. 1 shows an example of a conventional GTO. Referring to FIG. 1, a cathode electrode 2 and a gate electrode 3 are alternately provided on one principal surface of a semiconductor substrate 1, and are connected to a cathode terminal 5 and a gate terminal 6, respectively. Further, an anode electrode 4 is provided on the other principal surface of the substrate 1, and is connected to an anode terminal 7. FIG. 2 is vertical sectional view showing part of the GTO of FIG. 1. In FIG. 2, the same reference numerals as in FIG. 1 designate the same parts. As shown in FIG. 2, the semiconductor substrate 1 includes an n-emitter layer 20, a p-base layer 30, an n-base layer 10, and a p-emitter layer 40.

The structure shown in FIG. 2 is considered to be a unit GTO structure, and the GTO of FIG. 1 can be formed by combining a plurality of unit GTO structures in parallel. That is, each n-emitter region 20 has the form of a strip, and the cathode electrode 2 is kept in ohmic contact with each strip-shaped n-emitter region 20. A pair of gate electrodes 3 are kept in ohmic contact with the p-base layer 30 on both sides of each strip-shaped n-emitter region 20 with respect to the direction of the width thereof, and are connected directly with the gate terminal 6. The anode electrode 4 is kept in ohmic contact with the p-emitter layer 40. Further, a passivation film such as a silicon oxide film, a glass film, or a silicone rubber film is provided on a surface portion of the semiconductor substrate 1 where a pn junction is exposed, though the passivation film is not shown in FIGS. 1 and 2. Further, the semiconductor substrate 1 is doped with a lifetime killer such as gold.

Next, explanation will be made of the turn-off action of the conventional GTO, with reference to FIG. 2. In order to turn off the GTO which has been put in a conductive state, a gate current has to be drawn out from the gate electrode 6. At this time, excess carriers which have been accumulated in the p-base layer 30 to keep the GTO at the conductive state, are drawn out in such a manner that carriers existing in close proximity to the gate electrode 3 are first swept out and then carriers existing in a place apart from the gate electrode 3 are swept out. As a result, a conductive region which allows a main current to flow across the semiconductor substrate 1, gradually changes in a turned-off state from the gate electrode side. Accordingly, in the conventional GTO, a gate current is drawn out equally from both sides of the n-emitter region 20, and finally the conductive region $C_1$ is left only at a central portion of the n-emitter region 20. That is, the main current is concentrated to such a narrow conductive region. That portion of the p-base layer 30 which exists beneath the n-emitter region 20 and has been changed into the turned-off state, has no excess carriers, and therefore the resistance of that portion has a value equivalent to that at the thermal equilibrium. Hence, the resistance r of a gate current path from the gate electrode 3 to the conductive region which is located beneath the central portion of the n-emitter region 20, becomes larger than a value at an initial stage of turn-off action, and thus the gate current is hard to be drawn out. When a gate current sufficient to completely turn off the GTO cannot be drawn out in the above state, the temperature rise in the current concentration region due to power loss becomes very large, and thus thermal destruction occurs.

An area of safety operation (hereinafter simply referred to as "ASO") has hitherto been used for indicating whether a GTO can be turned off without being damaged, or not. The ASO is an area which is obtained by plotting anode-cathode voltages and anode currents capable of turning off a GTO without any damage thereto, as abscissa and ordinate, respectively. Accordingly, it is preferred that a GTO has a large ASO. FIG. 3 shows an example of ASO. In FIG. 3, a hatched area indicates the ASO. A GTO can be safely turned off as long as the locus of the operating point indicating the anode current and anode-cathode voltage at a turn-off period lies in the hatched area. Alternatively, the ASO may be expressed by using the cathode current density in place of the anode current. Further, in the case where a GTO is turned off at a specified cathode current density, a maximum anode-cathode voltage at which the GTO can be turned off without any damage thereto, may be used to indicate the magnitude of the ASO.

In the conventional GTO, various countermeasures have been taken to enlarge the ASO. That is, as shown in FIG. 2, the gate electrode 3 is provided on both sides of the n-emitter region 20, the width of the n-emitter region 20 is made narrow, and the thickness of the n-base layer 10 is made large. However, it is impossible to enlarge the ASO beyond a certain limit. In fact, when a GTO is turned off at a cathode current density of about 1,000 A/cm$^2$, the maximum anode-cathode voltage, at which the GTO can be safely turned off, does not exceed 200 or 300 V. Accordingly, a protection circuit such as the so-called snubber circuit is required, to safely operate the GTO. Thus, a device including the GTO is complicated in circuit construction and is large in size.

An object of the present invention is to provide a semiconductor device in which the mechanism for drawing out a current from a control electrol in a turn-off period is improved to enlarge the ASO.

Another object of the present invention is to provide a semiconductor device in which circuit elements included in a snubber circuit such as a resistor and a capacitor can be made small in size to make the semiconductor device small in size and simple in circuit construction.

In order to attain the above objects, according to an embodiment of the present invention, there is provided a semiconductor device which comprises: a semiconductor substrate including at least three semiconductor layers between a pair of principal surfaces, adjacent ones of the semiconductor layers being different in conductivity type from each other, a first one of the semiconductor layers being formed of at least one strip-shaped region with a substantially constant width, a second one of the semiconductor layers being exposed to a first principal surface of the semiconductor substrate together with the strip-shaped region; a first main electrode kept in ohmic contact with the strip-shaped region at the first principal surface; a first control electrode kept in ohmic contact with the second semiconductor layer on one side of the strip-shaped region with respect to the direction of the width thereof and connected directly to a control terminal; a second control electrode kept in ohmic contact with the second semiconductor layer on the other side of the strip-shaped region in the direction of the width thereof and connected to the control terminal through the first control electrode and the resistance of the second semiconductor layer between the first control electrode and the second control electrode; a second main electrode kept in ohmic contact with a second principal surface of the semiconductor substrate; and means provided in the semiconductor substrate for accelerating the spatial biasing of a conductive region to the other side of the strip-shaped region in the direction of the width thereof when a current flowing across the semiconductor substrate is cut off. The above means will be hereinafter referred to as "bias accelerating means".

The bias accelerating means includes one or both of means for increasing the internal resistance ascribed to other portions of said second semiconductor layer than a portion which exists between the first control electrode and second control electrode in a region between the strip-shaped region and a third one of the semiconductor layers, and means for making the amount of carrier appearing on one side of the strip-shaped region in the direction of the width thereof in a conductive state smaller than the amount of carrier appearing on the other side of the strip-shaped region.

First, explanation will be made of the operation principle of a GTO according to the present invention.

The present inventors have found that the ASO of a GTO can be greatly enlarged by connecting alternate ones of gate electrodes to a gate terminal as shown in FIG. 4. The inventors have further studied the above fact experimentally and theoretically, and have found that the above enlargement of ASO is based upon the following mechanism. FIG. 5 is a vertical sectional view showing one unit GTO structure included in the GTO of FIG. 4. In FIGS. 4 and 5, the same reference numerals as in FIGS. 1 and 2 designate identical or equivalent parts. Referring to FIG. 5, first and second gate electrodes 3a and 3b are kept in ohmic contact with the p-base layer 30 on both sides of the strip-shaped n-emitter region 20. The first gate electrode 3a is connected directly to the gate terminal 6, and the second gate electrode 3b is connected to the gate terminal 6 through a resistance R. The resistance R is an internal resistance ascribed to the p-base layer 30, as will be explained later.

Owing to the presence of the resistance R, a gate current is drawn out mainly from one side (that is, the first gate electrode (3a) side) of the strip-shaped n-emitter region 20 at an initial stage of turnoff action. Accordingly, a conductive region gradually changes into a turned-off state from the first gate electrode (3a) side. Thus, a current flowing across the semiconductor substrate 1 is concentrated to a portion C$_2$ which exists near the gate electrode 3B. FIG. 6 is a plan view showing the cathode side of the unit GTO structure shown in FIG. 5. As in the conventional GTO, a current flowing across the semiconductor substrate 1 is concentrated to a region indicated by a spot S, at the final stage of turn-off action. However, in the conventional GTO, the current spot S is formed in the vicinity of the center of the n-emitter region 20 with respect to the direction of the width thereof. On the other hand, in the GTO shown in FIGS. 4 and 5, the current spot S is formed at a position near the gate electrode 3b. At this time, the resistance r$_1$ of the p-base layer 30 between the current spot S and the gate electrode 3a is fairly large, and therefore it is hard to draw out a gate current from the first gate electrode (3a) side. In contrast to the above, the gate current is readily drawn out from the second gate electrode (3b) side. This is because a current path such as indicated by broken lines in FIG. 6 is formed in the p-base layer 30. In more detail, the current spot S is formed in close proximity to the second gate electrode 3b, and therefore the resistance r$_2$ of the p-base layer 30 between the current spot S and the second gate electrode 3b is fairly small. Further, the whole of that portion of the p-base layer 30 which exists beneath the n-emitter region 20, is included in the above current path, though only two broken lines are shown in FIG. 6 for brevity's sake. Accordingly, the resistance between the first and second gate electrodes 3a and 3b (that is, the resistance R shown in FIG. 5) is fairly small. Thus, a relatively large amount of gate current can be drawn out through the current path indicated by the broken lines, and therefore the ASO of the GTO is enlarged.

In order to surely turn off a GTO which operates on the basis of the above principle, it is required to rapidly limit (or bias) a conductive region to the second gate electrode (3b) side. That is, it is required that the capability of drawing out carriers from the first gate electrode (3a) side is high and the carrier accumulated on this side is rapidly decreased.

The drawing-out of gate current becomes easy as a change in internal resistance R at a turn-off action is made larger, as will be explained below in detail. At the initial stage of turn-off action, a conductive region spreads over the whole of the n-emitter region 20, and therefore the current path which is indicated by the broken lines in FIG. 6, is not formed. At this time, the internal resistance R is ascribed to a current path which goes around or detours the both ends of the n-emitter region 20 viewed in the lengthwise direction thereof and is indicated by the dot-dash lines in FIG. 6. When the resistance of the current path indicated by the dot-dash lines is small, the gate current is drawn out not only from the first gate electrode (3a) side but also from the second gate electrode (3b) side, at the initial stage of turn-off action. As the gate current drawn out from the second gate electrode (3b) side is made larger, the gate current drawn out from the first gate electrode (3a) side decreases and the conductive region $C_2$ is slowly limited (or biased) to the second gate electrode (3b) side. Accordingly, it is preferred that the current path indicated by the dot-dash lines has a large resistance. On the other hand, the current spot S formed in close proximity to the second gate electrode 3b is readily extinguished, as the gate current which is drawn out from the second gate electrode (3b) side at the final stage of turn-off action, is larger.

Even if the resistance of the current path indicated by the dot-dash lines is made large, the resistance of the current path indicated by the broken lines is sufficiently small, and therefore the resultant resistance of these resistances will be increased only a little. Accordingly, when the whole turn-off process is considered, it is preferred that the resistance of the current path indicated by the dot-dash lines is made large to rapidly form the current spot S on the second gate electrode (3b) side, and to rapidly reduce the resistance of the current path indicated by the broken lines, to a very small value.

Based upon the above thought, a GTO according to the present invention includes means for increasing the resistance of the current path indicated by the dot-dash lines, that is, means for increasing the internal resistance ascribed to other portions of the p-base layer 30 (namely, the second semiconductor layer) then a portion which exists between the gate electrodes (namely, control electrodes) in a region between the n-emitter region (namely, the first semiconductor layer) and the n-base layer (namely the third semiconductor layer) adjacent to the p-base layer (namely, the second semiconductor layer). In other words, the semiconductor device includes the previously-mentioned bias accelerating means.

The present inventors have experimentally studied how the anode-cathode voltage immediately before damage in the case where a predetermined main current is cut off, is dependent upon the resistance of the current path indicated by the dot-dash lines, and have confirmed that the above anode-cathode voltage increases and the ASO is enlarged as the above resistance is made larger.

Further, when the semiconductor substrate 1 having a structure that a conductive portion near the gate electrode 3a can readily change into a turned-off state, is used in addition to the gate structure shown in FIGS. 4 and 5, a conductive region is more readily biased spatially to the second gate electrode (3b) side, and thus the ASO is further enlarged.

In view of the above, in the present invention, means for making the carrier concentration in the vicinity of the first gate electrode 3a smaller than that in the vicinity of the second gate electrode 3b, is used as the bias accelerating means, to carry out a turn-off process on the first gate electrode (3a) side rapidly at the initial stage of turn-off action.

As can be seen from the above, the ASO of a semiconductor device can be enlarged by improving the structure of the control electrode and the junction structure in a semiconductor substrate. Accordingly, the resistor and capacitor included in a snubber circuit can be made small in size, or the snubber circuit can be omitted. Thus, a semiconductor device according to the present invention can be made small in size and simplified in circuit construction.

The present invention will be more apparent from the following description of preferred embodiments of the invention taken in conjunction with the accompanying drawings, in which.

Figure 1:
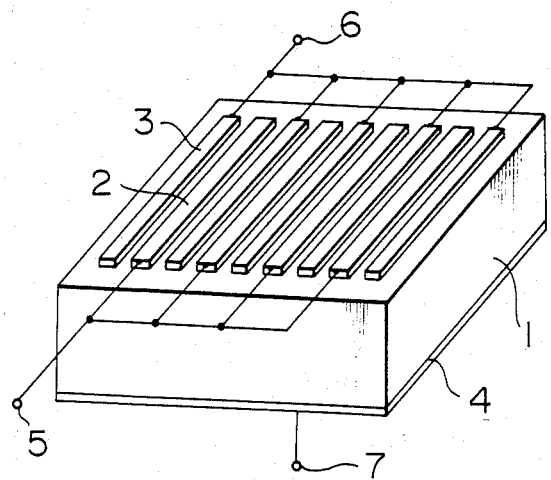
FIG. 1 is a schematic perspective view showing a conventional GTO.
Figure 2:
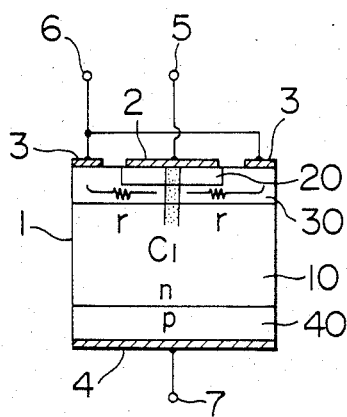
FIG. 2 is a vertical sectional view showing part of the conventional GTO of FIG. 1.
Figure 3:
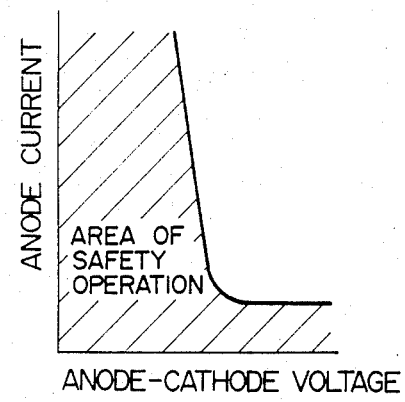
FIG. 3 is a graph for explaining the ASO.

Now, the present invention will be explained below, on the basis of the embodiments shown in the drawings.

Figure 4:
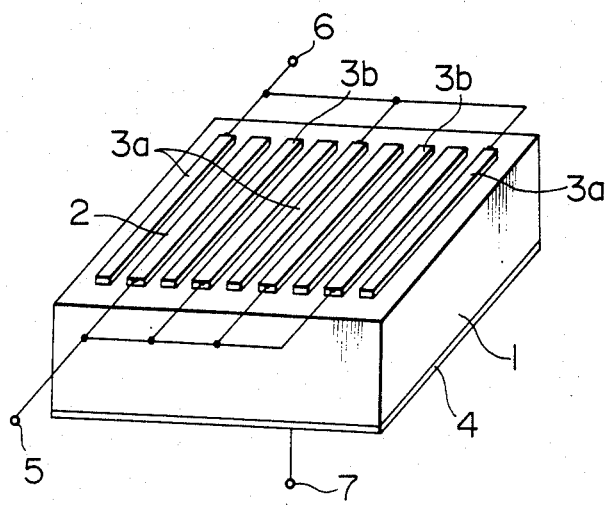
FIG. 4 is a schematic perspective view showing a GTO, to which the present invention is applied.
Figure 5:
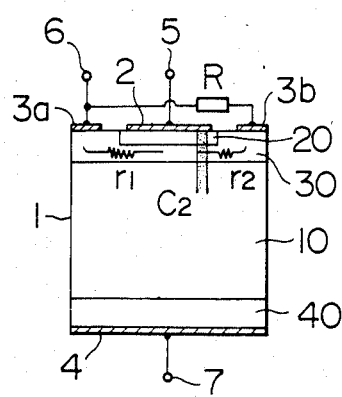
FIG. 5 is a vertical sectional view showing part of the GTO of FIG. 4.
Figure 6:
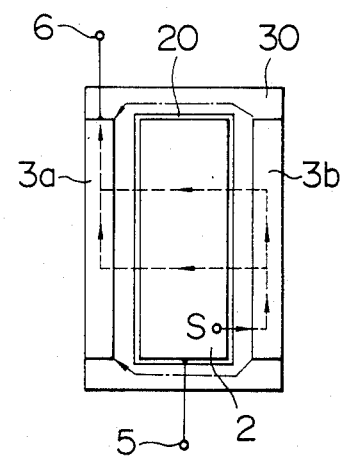
FIG. 6 is a plan view showing the cathode side of the unit GTO structure shown in FIG. 5.

In FIGS. 7 through 20 which show various embodiments of the present invention, the same reference numerals as in FIGS. 4 through 6 designate identical or equivalent parts.

Figure 7:
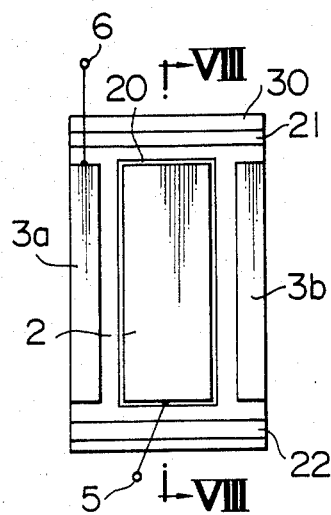
FIG. 7 is a plan view showing the cathode side of a unit GTO structure included in a first embodiment of a GTO according to the present invention.
Figure 8:
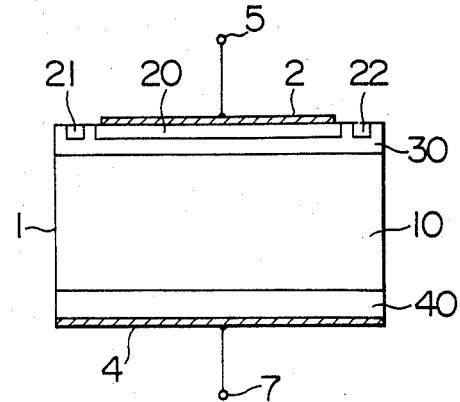
FIG. 8 is a vertical section view taken along the line VIII—VIII of FIG. 7.

FIG. 7 is a plan view showing the cathode side of one unit GTO structure included in a first embodiment of a GTO according to the present invention, and corresponds to FIG. 6. FIG. 8 is a vertical sectional view taken along the line VIII—VIII of FIG. 7. In the present unit GTO structure, n-diffusion regions 21 and 22 which serve as the bias accelerating means, are provided in the p-base layer 30 in close proximity to both ends of the n-emitter region 20 viewed in the lengtheise direction thereof. Owing to the presence of the n-diffusion regions 21 and 22, the internal resistance ascribed to that portion of the p-base layer 30 which is located around each n-diffusion region, is increased. The n-diffusion regions 21 and 22 are isolated from the n-emitter region 20. The cathode electrode 2 is not formed on the n-diffusion regions 21 and 22, but a passivation film (not shown) is provided thereon.

The n-diffusion regions 21 and 22 may be provided in each unit GTO structure, independently of the remaining unit GTO structures, or may be continuously provided in adjacent unit GTO structures. The above-mentioned increase in internal resistance due to the n-diffusion regions 21 and 22 is dependent upon the shape thereof.

Figure 9:
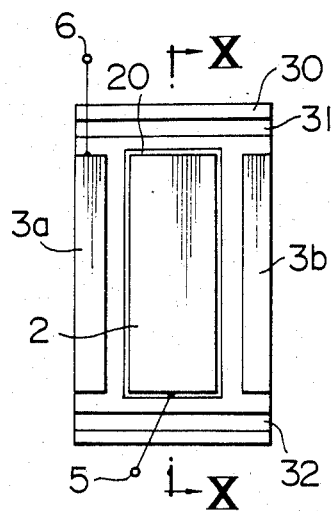
FIG. 9 is a plan view showing the cathode side of a unit GTO structure included in a second embodiment of a GTO according to the present invention.
Figure 10:
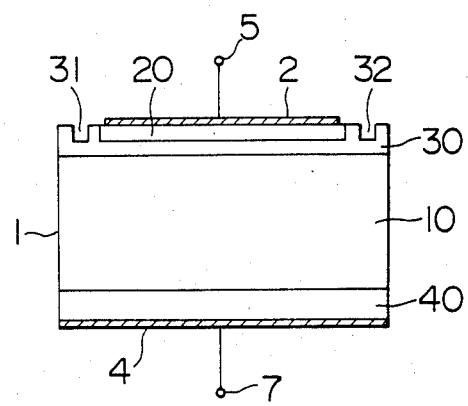
FIG. 10 is a vertical sectional view taken along the line X—X of FIG. 9.

FIGS. 9 and 10 show one unit GTO structure included in a second embodiment of a GTO according to the present invention. In the present unit GTO structure, grooves 31 and 32 which serve as the bias accelerating means, are provided in the p-base layer 30, in place of the n-diffusion regions 21 and 22. A passivation film (not shown) is provided in each of the grooves 31 and 32.

Figure 11:
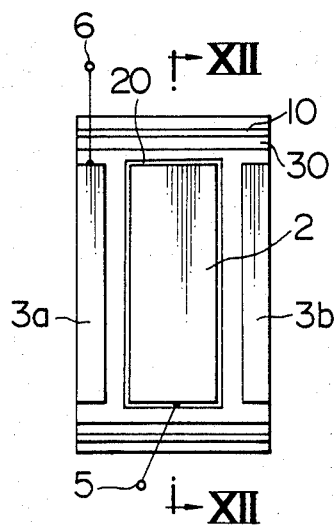
FIG. 11 is a plan view showing the cathode side of a unit GTO structure included in a third embodiment of a GTO according to the present invention.
Figure 12:
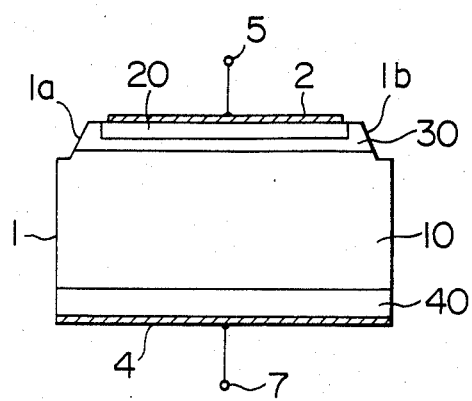
FIG. 12 is a vertical sectional view taken along the line XII—XII of FIG. 11.

FIGS. 11 and 12 show one unit GTO structure included in a third embodiment of a GTO according to the present invention. In the present unit GTO structure, the p-base layer 30 and that portion of the n-base layer 10 which is adjacent to the p-base layer 30, are removed, along both ends of the n-emitter region 20 viewed in the lengthwise direction thereof, by well-known semiconductor techniques such as etching, so as to form a mesa structure. Accordingly, the pn junction formed between the p-base layer 30 and n-base layer 10 is exposed to inclined side surfaces 1a and 1b of the mesa structure.

Figure 13:
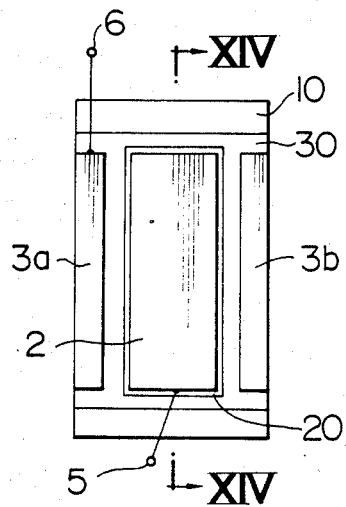
FIG. 13 is a plan view showing the cathode side of a unit GTO structure included in a fourth embodiment of a GTO according to the present invention.
Figure 14:
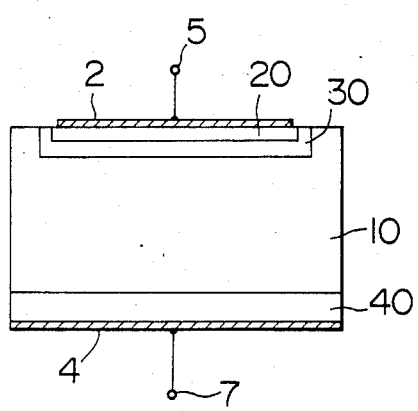
FIG. 14 is a vertical sectional view taken along the line IV—IV of FIG. 13.

FIGS. 13 and 14 show one unit GTO structure included in a fourth embodiment of a GTO according to the present invention. In this unit GTO structure, the pn junction formed between the p-base layer 30 and n-base layer 10 is exposed to a principal surface of the semiconductor substrate 1 which is provided with the cathode electrode 2, along both ends of the n-emitter region 20 viewed in the lengthwise direction thereof. The resistance of a current path such as indicated by dot-dash lines in FIG. 6 increases as the exposed portion of the above pn junction comes nearer to the exposed portion of a pn junction formed between the n-emitter region 20 and the p-base layer 30.

In all of the unit GTO structures shown in FIGS. 7 through 14, the internal resistance ascribed to that portion of the p-base layer 30 which exists outside of both longitudinal ends of the elongated n-emitter region 20 is increased by reducing the cross section of the above portion of the p-base region parallel to the lengthwise direction of the n-emitter region 20. Accordingly, a gate current which is drawn out through the second gate electrode 3b at the initial stage of turn-off action, is far smaller than a gate current which is drawn out through the first gate electrode 3a at the above stage. Therefore, a conductive region is rapidly biased to the gate electrode (3b) side, and moreover is brought to a place which is nearer to the second gate electrode 3b.

In the above-mentioned unit GTO structure, the p-emitter layer 40 spreads over the whole area of the lower principal surface of the semiconductor substrate 1. However, the present invention is also applicable to a unit GTO structure, in which part of the p-emitter layer 40 is removed, and a highly-doped n-semiconductor region formed in the removed portion is kept in ohmic contact with the anode electrode to form a GTO of shorted anode emitter type.

Next, explanation will be made on the case where means for making the concentration of carrier accumulated in the vinicity of the first gate electrode 3a smaller than the concentration of carrier accumulated in the vicinity of the second gate electrode 3b, is used as the bias accelerating means.

Figure 15:
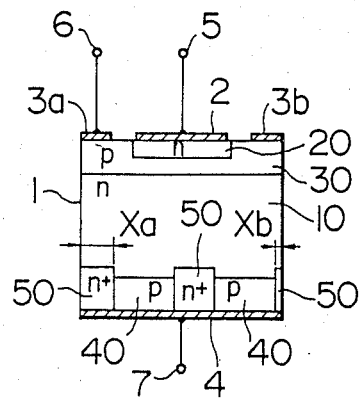
FIG. 15 is a vertical sectional view showing a unit GTO structure included in a fifth embodiment of a GTO according to the present invention.

FIG. 15 is a vertical sectional view showing one unit GTO structure included in a fifth embodiment of a GTO according to the present invention, which embodiment is of shorted anode emitter type. Referring to FIG. 15, the anode electrode 4 is connected not only with the p-emitter layer 50 having the form of a strip or an elliptical ring, but also with the n-base layer 10 through highly-doped, n-semiconductor regions (hereinafter simply referred to as a "shorting region") 50. A first shorting region is provided in an area which is defined by the projection of the n-emitter region 20 on the lower principal surface of the semiconductor substrate. Further, the width $X_a$ of a second shorting region which is provided on the first gate electrode (3a) side, is made larger than the width $X_b$ of a third shorting region which is provided on the second gate electrode (3b) side. In a GTO of shorted anode emitter type, an anode current in a conductive state is constituted of a hole current injected from the p-emitter layer 40 and an electron current flowing through the shorting regions 50. Accordingly, as a ratio of the area of the shorting regions 50 to the area of the p-emitter layer 40 is larger, the electron current increases and the hole current decreases. In the unit GTO structure shown in FIG. 15, the width $X_a$ is larger than the width $X_b$, and therefore the shorting region on the first gate electrode (3a) side is larger in area than the shorting region on the second gate electrode (3b) side. Thus, electrons are readily absorbed without inducing much hole injection in the first gate side. Accordingly, only a small amount of positive hole is injected on the first gage electrode (3a) side, and therefore a conductive portion in the vicinity of the first gate electrode 3a readily changes into a turned off state. Thus, a conductive region is rapidly concentrated to the second gate electrode (3b) side. Further, as mentioned previously, that portion of the p-base layer 30 which exists in the vicinity of the second gate electrode 3b, can efficiently draw out a gate current at the final stage of turn-off action. Thus, the ASO is enlarged.

Figure 16:
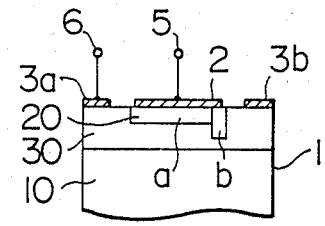
FIG. 16 is a vertical sectional view showing a main part of a unit GTO structure included in a sixth embodiment of a GTO according to the present invention.
Figure 17:
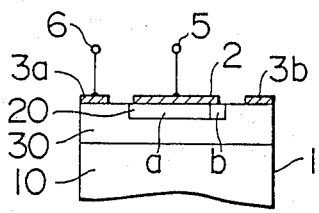
FIG. 17 is a vertical sectional view showing a main part of a unit GTO structure included in a seventh embodiment of a GTO according to the present invention.

FIGS. 16 and 17 show unit GTO structures included in sixth and seventh embodiments of a GTO according to the present invention. In these unit GTO structures, the amount of carrier (that is, electron) injected from the n-emitter region 20 is made small on the first gate electrode (3a) side. Each of these unit GTO structures will be explained below, in more detail.

In the unit GTO structure of FIG. 16, a portion b of the n-emitter region 20 which is located near the second gate electrode 3b, is made larger in depth than the remaining portion a. That is, that portion of the p-base layer 30 which exists beneath the portion b, is smaller in thickness than that portion of the p-base layer 30 which exists beneath the portion a. As a result, the probability that the electron injected from the portion b recombines with a positive hole before the electron reaches the n-base layer 10, is smaller than the probability that the electron injected from the portion a recombines with a positive hole before reaching the n-base layer 10. Accordingly, the amount of effective carrier injected from the n-emitter region 20 is larger on the second gate electrode (3b) side than on the first gate electrode (3a) side, and thus the ASO can be enlarged.

In the unit GTO structure of FIG. 17, a portion b of the n-emitter region 20 which is located near the second gate electrode 3b is made layer in impurity concentration than the remaining portion a of the n-emitter region 20. Thus, the injection rate of electron at the portion b is larger than that at the portion a.

Figure 18:
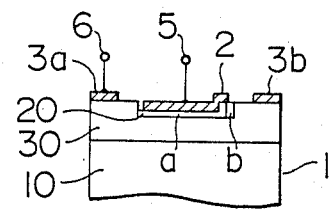
FIG. 18 is a vertical sectional view showing a main part of a unit GTO structure included in an eighth embodiment of a GTO according to the present invention.

FIG. 18 shows one unit GTO structure included in an eighth embodiment of a GTO according to the present invention. In this unit GTO structure, the n-emitter region 20 is partly etched. An etched portion a of the n-emitter region 20 is devoid of a highly-doped surface part. Accordingly, the mean impurity concentration of the portion a is smaller than that of the remaining portion b which is located near the second gate electrode 3b. Thus, the same effect as in the unit GTO structure of FIG. 17 can be obtained. It is to be noted that the n-emitter regions shown in FIGS. 16 and 17 are formed by a double diffusion process, and the n-emitter region 20 of FIG. 18 can be formed by a single diffusion process.

It is possible to combine over of the unit GTO structures shown in FIGS. 16 through 18 with the unit GTO structure shown in FIG. 15. It is also possible to combines one of the unit GTO structures shown in FIGS. 15 through 18 with one of the unit GTO structures shown in FIGS. 7 through 14. Further, in the unit GTO structures shown in FIGS. 5 and 15, a portion of the semiconductor substrate 1 which is located on the first gate electrode (3a) side, may be selectively doped with a lifetime killer or may be irradiated with an electron beam, to form a recombination center, thereby promoting the recombination of carrier at the initial stage of turn-off action.

The structures shown in FIGS. 7 through 14 and FIGS. 16 through 18 are applicable to a TRS.

Figure 19:
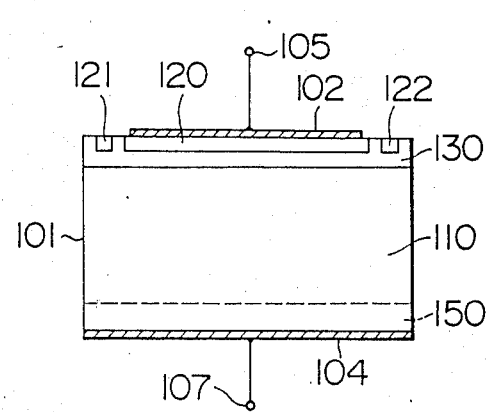
FIG. 19 is a vertical sectional view showing a unit TRS structure included in an embodiment of a TRS device according to the present invention.
Figure 20:
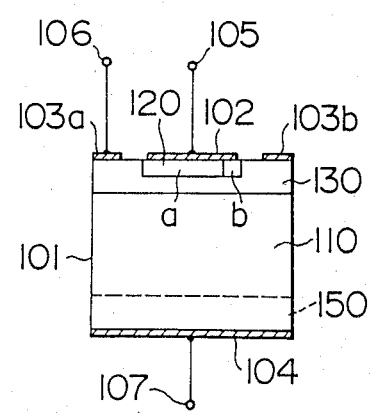
FIG. 20 is another vertical sectional view taken along a direction prependicular to the cross section of FIG. 19.

FIGS. 19 and 20 show an embodiment of a TRS element according to the present invention. FIG. 19 is a vertical sectional view showing this embodiment, and the cross section shown in FIG. 19 corresponds to the cross section shown in FIG. 8. FIG. 20 is another vertical sectional view taken along a direction perpendicular to the cross section of FIG. 19, and the cross section shown in FIG. 20 corresponds to the cross section shown in FIG. 17.

Referring to FIGS. 19 and 20, a semiconductor substrate 101 includes an n-collector layer 110, a highly-doped n-collector layer 150, a p-base layer 130, and an n-emitter layer 120. The emitter junction formed between the p-base layer 130 and n-emitter layer 120 is a planar junction. A pair of n-diffusion regions 121 and 122 are formed in the p-base layer 130, to increase the internal resistance ascribed to those portions of the p-base layer 130 which exist in the vicinity of the diffusion regions 121 and 122. The n-emitter layer 120 includes a slightly-doped portion a and a highly-doped portion b. An emitter electrode 102 and a collector electrode 104 are kept in ohmic contact with the n-emitter layer 120 and the highly-doped n-collector layer 150, respectively. Further, base electrodes 103a and 103b are kept in ohmic contact with the p-base layer 130°. The emitter electrode 102 and the collector electrode 104 are connected to an emitter terminal 105 and a collector terminal 107, respectively. As to the base electrodes, only the first base electrode 103a which is located near the slightly-doped portion a of the n-emitter layer 120, is connected directly to a base terminal 106.

In the present embodiment, the n-diffusion regions 121 and 122 are formed in the p-base layer 130 to increase the above-mentioned internal resistance, and moreover the n-emitter layer 120 includes two portions which are different in impurity concentration from each other. Thus, a conductive portion is rapidly biased to the second base electrode (103b) side, and a large ASO is obtained.

When the highly-doped n-collector layer 150 is replaced by a p-semiconductor layer, a GTO according to the present invention is obtained.

As shown in the above, a GTO or TRS having a further enlarged ASO can be formed by appropriately combining the structures shown in FIGS. 7 through 14 with the structures shown in FIGS. 15 through 18.

Further, the present invention is not limited to a semiconductor substrate, in which n-emitter regions are arranged in parallel as shown in FIG. 4, but is applicable to a semiconductor substrate, in which n-emitter regions are arranged so as to form the well-known radial or involute pattern, or arranged in a plurality of rows as described in U.S. Pat. No. 3,474,305.

As has been explained in the foregoing, according to the present invention, the drawing-out of current from a control terminal in a turn-off period is carried out in a favorable manner, and thus a GTO or TRS having a large ASO can be obtained.

We claim:

1. A semiconductor device comprising:
    a semiconductor substrate including at least three semiconductor layers between a pair of principal surfaces, adjacent ones of said semiconductor layers being different in conductivity type from each other, a first one of said semiconductor layers being formed of at least one strip-shaped region with a constant width and a predetermined length, a second one of said semiconductor layers being exposed to a first principal surface of said semiconductor substrate together with said strip-shaped region;
    a first main electrode kept in ohmic contact with said strip-shaped region at said first principal surface;
    a first control electrode kept in ohmic contact with said second semiconductor layer on one side of said strip-shaped region in the direction of the width thereof and connected directly to a control terminal;
    turn-off control means for drawing out current during a final stage of turn-off of said device comprising a second control electrode kept in exclusive ohmic contact with said second semiconductor layer on the other side of said strip-shaped region in the direction of the width thereof, being free of all direct connections to any external or internal points, and being exclusively coupled through the resistance of said second semiconductor layer to the control terminal of the first control electrode;

a second main electrode kept in ohmic contact with a second principal surface of said semiconductor substrate; and means provided in said second semiconductor layer for increasing the internal resistance of said second semiconductor layer which is adjacent to ends of the strip-shaped portion.

2. A semiconductor device according to claim 1, wherein said means for increasing said internal resistance is a diffusion region which is formed in said second semiconductor layer or the outside of both ends of said strip-shaped region viewed in the lengthwise direction thereof and has the same conductivity type as said strip-shaped region.

3. A semiconductor device according to claim 1, wherein said means for increasing said internal resistance is a groove which is provided in said second semiconductor layer on the outside of both ends of said strip-shaped region viewed in the lengthwise direction thereof.

4. A semiconductor device according to claim 1, wherein said means for increasing said internal resistance is a cut-out portion which is provided for said second and third semiconductor layers on the outside of both ends of said strip-shaped region viewed in the lengthwise direction thereof.

5. A semiconductor device according to claim 1, wherein said means for increasing said internal resistance is formed by exposing a pn junction which is formed between said second semiconductor layer and said third semiconductor layer, to said first principal surface on the outside of said strip-shaped region in the lengthwise direction thereof, and by locating said pn junction in close proximity to another pn junction which is formed between said strip-shaped region and said second semiconductor layer.

* * * * *